(12) United States Patent
Koike

(10) Patent No.: US 12,537,439 B2
(45) Date of Patent: Jan. 27, 2026

(54) SEMICONDUCTOR DEVICE

(71) Applicant: FUJI ELECTRIC CO., LTD., Kawasaki (JP)

(72) Inventor: Atsuya Koike, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 231 days.

(21) Appl. No.: 18/344,842

(22) Filed: Jun. 29, 2023

(65) Prior Publication Data

US 2024/0039390 A1 Feb. 1, 2024

(30) Foreign Application Priority Data

Jul. 27, 2022 (JP) .................................. 2022-119641

(51) Int. Cl.
| | | |
|---|---|---|
| *H02M 1/088* | (2006.01) | |
| *H02M 3/158* | (2006.01) | |
| *H02M 7/5387* | (2007.01) | |
| *H03K 3/037* | (2006.01) | |

(52) U.S. Cl.
CPC ........... *H02M 1/088* (2013.01); *H02M 3/158* (2013.01); *H02M 7/53871* (2013.01); *H03K 3/037* (2013.01)

(58) Field of Classification Search
CPC ........ H02M 1/088; H02M 1/08; H02M 1/081; H02M 1/082; H02M 1/084; H02M 1/0845; H02M 1/096; H02M 3/158; H02M 3/157; H02M 3/1566; H02M 3/1586; H02M 7/53871; H02M 7/53873; H02M 7/53875; H02M 7/53876; H02M 7/53878; H02M 7/5387; H02M 7/53854; H02M 7/53862

See application file for complete search history.

(56) References Cited

U.S. PATENT DOCUMENTS 5,729,449 A * 3/1998 Takada .............. H02M 7/53875
388/811
2020/0403510 A1 12/2020 Nonaka

FOREIGN PATENT DOCUMENTS

| JP | H11178349 A | 7/1999 |
|---|---|---|
| JP | 2002027665 A | 1/2002 |
| JP | 2008125178 A | 5/2008 |
| JP | 2012060793 A | 3/2012 |
| JP | 2021002939 A | 1/2021 |

* cited by examiner

*Primary Examiner* — Nguyen Tran

(74) *Attorney, Agent, or Firm* — Rabin & Berdo, P.C.

(57) ABSTRACT

A semiconductor device includes a main circuit and a control circuit. The main circuit includes a plurality of series circuits that are connected in parallel to one another. Each series circuit includes a high-side switching element and a low-side switching element that are connected in series. The control circuit includes first to third input terminals through which a serial drive signal serving as a driving signal of each high-side switching element and each low-side switching element is inputted, a first clock signal, and a second clock signal are respectively inputted, and a plurality of output terminals. The control circuit holds the serial drive signal based on the first clock signal, and based on the second clock signal outputs, to each high-side switching element and each low-side switching element, parallel signals generated from the serial drive signal.

3 Claims, 17 Drawing Sheets

SEMICONDUCTOR DEVICE

CROSS-REFERENCE TO RELATED APPLICATION

This application is based upon and claims the benefit of priority of the prior Japanese Patent Application No. 2022-119641, filed on Jul. 27, 2022, the entire contents of which are incorporated herein by reference.

BACKGROUND OF THE INVENTION

1. Field of the Invention

The embodiments discussed herein relate to semiconductor devices.

2. Background of the Related Art

In recent years, semiconductor devices called intelligent power modules (IPMs) are under development. IPMs incorporate power semiconductor elements, such as insulated gate bipolar transistors (IGBTs), and a drive circuit for driving the power semiconductor elements.

IPMs are widely used, for example, in automotive electrical systems, such as transmissions, engines, and brakes, and there is a demand for products that achieve miniaturization, high performance, and high reliability. In such IPMs, the power semiconductor elements are driven and controlled based on signals transmitted from a controller having a processor, such as a micro processor unit (MPU).

A related technology has been proposed which, for example, code-transmits gate signals without a clock signal from a control circuit part to a main circuit part for each generation cycle and supplies, to power semiconductor elements, the gate signals restored by a gate drive circuit for each generation cycle (Japanese Laid-open Patent Publication No. 2012-60793). There is another proposed technology of converting multiple pulse-width modulated parallel gate signals into a serial gate signal, converting the serial gate signal transmitted through a signal transmission line into parallel gate signals synchronized with a clock signal, and organizing the parallel gate signals into gate signals for switching elements (Japanese Laid-open Patent Publication No. H11-178349).

IPMs are equipped with a protection function that monitors, for example, electric current flowing through power semiconductor elements and chip temperature of the power semiconductor elements and uses the monitoring results to protect the power semiconductor elements from being destroyed. There are also some protection functions newly added in recent years, such as temperature warning.

Thus, it could well be that IPMs would be equipped with even more functions and the number of pins in IPM packages would also increase as new functions are added. In such a case, it may be considered to develop new IPM packages to increase the number of pins; however, development of new packages incurs increased development costs, changes in substrate layouts, and the like. Therefore, there is a demand for products that allow a reduction in the number of pins used while maintaining existing functions of IPMs without developing new packages.

SUMMARY OF THE INVENTION

According to an aspect, there is provided a semiconductor device including a main circuit including a plurality of series circuits that are connected in parallel to one another, each series circuit including a high-side switching element and a low-side switching element that are connected in series and has a connection point therebetween, the main circuit being configured to supply electric power to a load through wires respectively connected to the connection points of the plurality of series circuits; and a control circuit including a first input terminal through which a serial drive signal serving as a driving signal of each high-side switching element and each low-side switching element is inputted, a second input terminal through which a first clock signal is inputted, a third input terminal through which a second clock signal is inputted, and a plurality of output terminals, the control circuit being configured to according to the first clock signal, hold the serial drive signal, and according to the second clock signal, output, to each high-side switching element and each low-side switching element through the plurality of output terminals, parallel signals that are generated from the serial drive signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
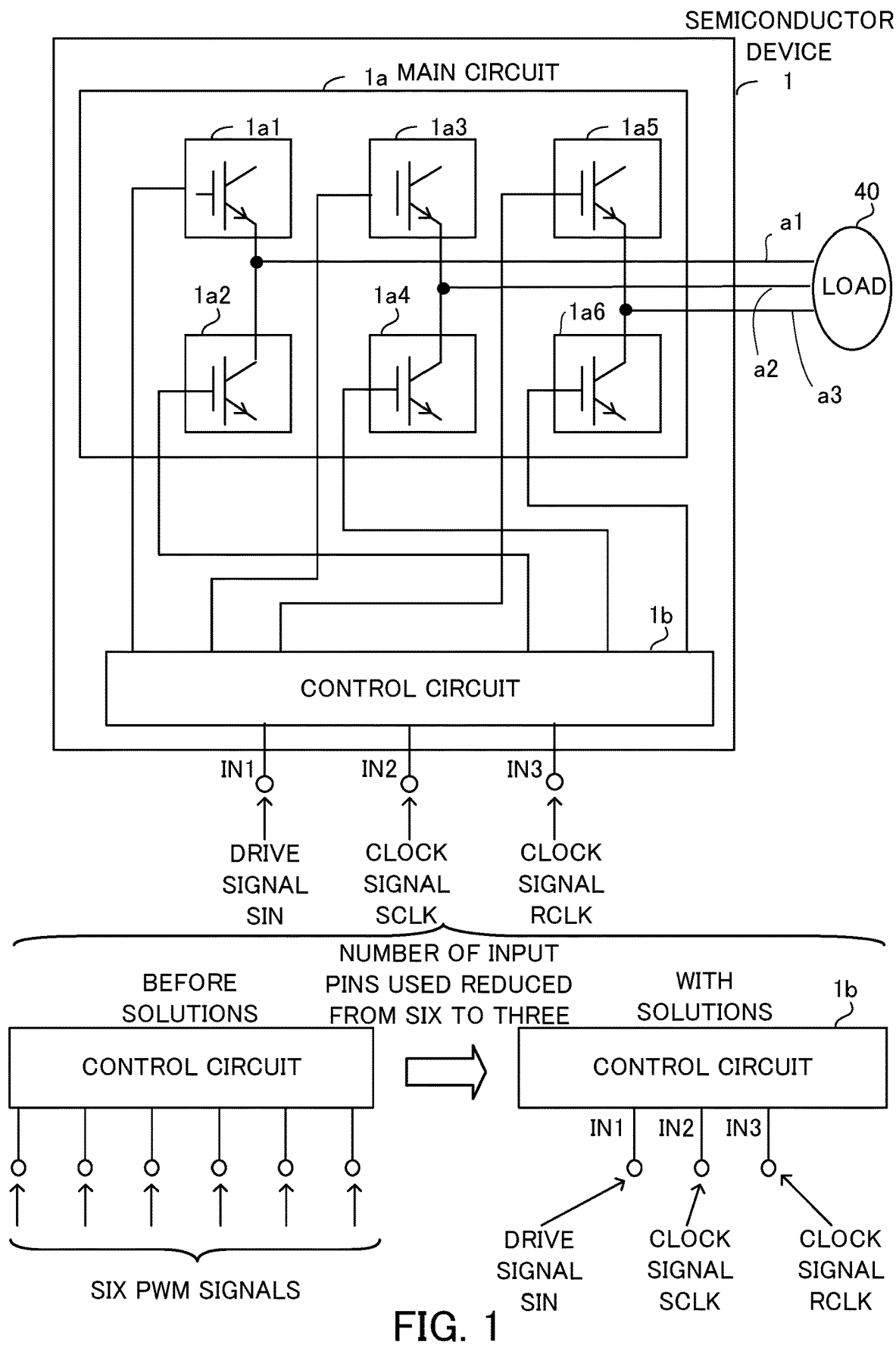
FIG. 1 illustrates an example of a semiconductor device according to an embodiment.

Several embodiments will be described below with reference to the accompanying drawings. In the following description and the accompanying drawings, like reference numerals refer to like elements having substantially the same functions, and a repeated description thereof may be omitted.

FIG. 1 illustrates an example of a semiconductor device according to an embodiment. A semiconductor device 1 includes a main circuit 1a and a control circuit 1b. The main circuit 1a includes high-side switching elements 1a1, 1a3, and 1a5 and low-side switching elements 1a2, 1a4, and 1a6.

In the main circuit 1a, series connections made between the high-side switching elements 1a1, 1a3, and 1a5 and the low-side switching elements 1a2, 1a4, and 1a6, respectively, are connected in parallel, and electric power is supplied to a load 40 through wires a1, a2, and a3 connected to connection points of the high-side switching elements 1a1, 1a3, and 1a5 and the low-side switching elements 1a2, 1a4, and 1a6, respectively.

The control circuit 1b receives a drive signal SIN, which is obtained by serializing pulse width modulation (PWM) signals for driving the high-side switching elements 1a1, 1a3, and 1a5 and the low-side switching elements 1a2, 1a4, and 1a6, and converts the drive signal SIN into parallel signals and then outputs the parallel signals to the main circuit 1a.

In addition, the control circuit 1b has input terminals IN1, IN2, and IN3. The serialized drive signal SIN is input to the input terminal IN1. A clock signal SCLK is input to the input terminal IN2. The clock signal SCLK is used, for example, as a clock signal for holding the drive signal SIN.

A clock signal RCLK is input to the input terminal IN3. The clock signal RCLK is used, for example, as a clock signal for generating, from the drive signal SIN held according to the clock signal SCLK, the parallel signals to be output to the main circuit 1a. The control circuit 1b also has output terminals used to output, to the high-side switching elements 1a1, 1a3, and 1a5 and the low-side switching elements 1a2, 1a4, and 1a6, the parallel signals generated, according to the clock signal RCLK, from the drive signal SIN held according to the clock signal SCLK.

In conventional configurations before solutions, the control circuit needs to have six input terminals for PWM signal reception to receive six PWM signals each driving the individual high-side switching elements 1a1, 1a3, and 1a5 and low-side switching elements 1a2, 1a4, and 1a6 in order to drive the main circuit 1a.

On the other hand, the semiconductor device 1 with the solutions has the input terminals IN1, IN2, and IN3 in order to receive the drive signal SIN obtained by superimposing and serializing the six PWM signals and the clock signals SCLK and RCLK used to generate the six PWM signals again by parallelizing the drive signal SIN.

That is, in the semiconductor device 1, the number of input pins (input terminals) used is reduced from six to three. In addition, the reduction in the number of input pins used allows for newly assigning different functions to the existing spare pins.

<Semiconductor Device with Number of Input Pins Reduced from 6 to 3>

Figure 2:
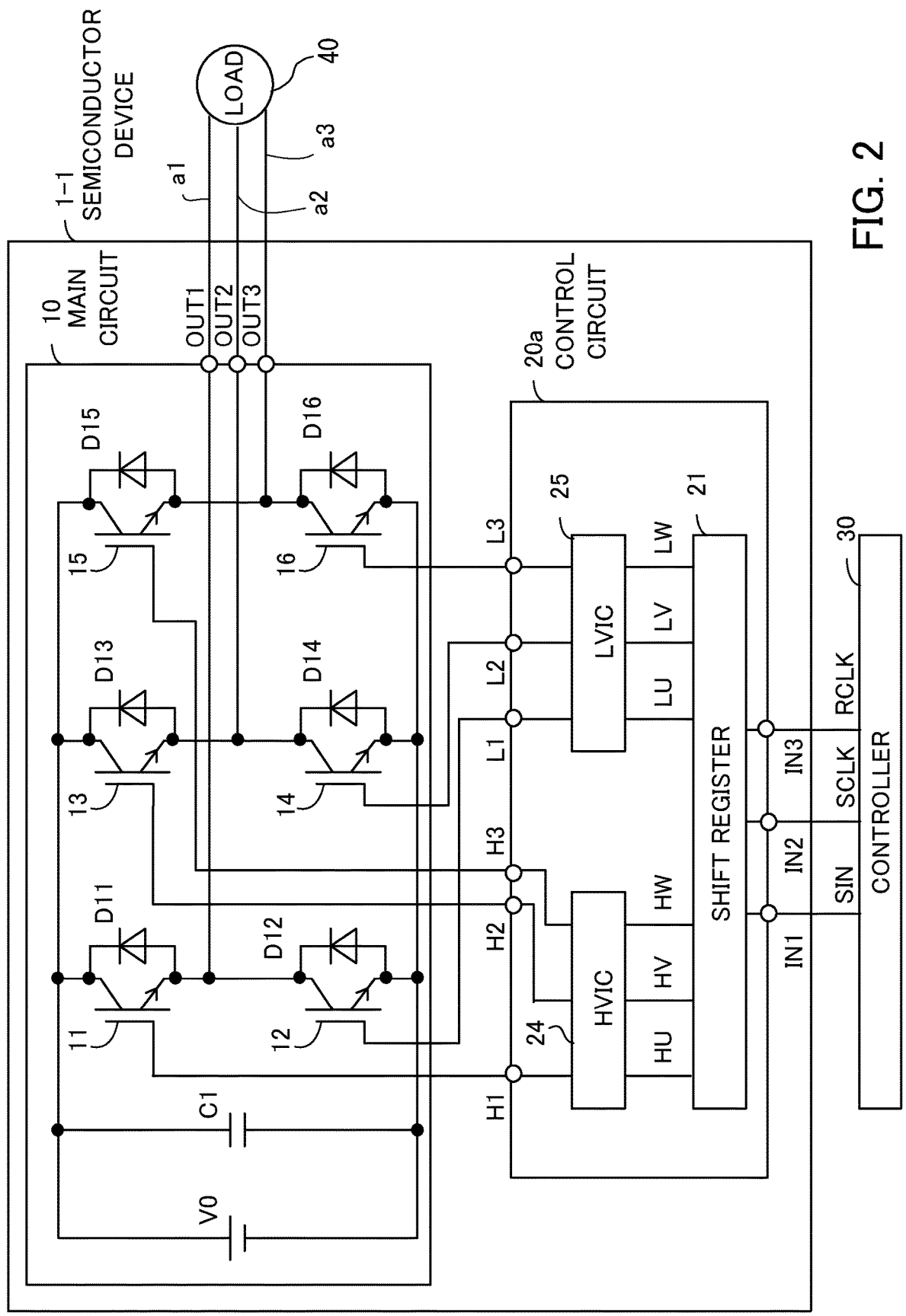
FIG. 2 illustrates a configuration example of another semiconductor device.

FIG. 2 illustrates a configuration example of a semiconductor device. A semiconductor device 1-1 is, for example, a device applied to a three-phase IPM for supplying power to the load 40. The semiconductor device 1-1 includes a main circuit 10 and a control circuit 20a. The load 40 is connected to the main circuit 10, and a controller 30 is connected to the control circuit 20a. The controller 30 includes a processor, such as an MPU (not illustrated).

The main circuit 10 includes IGBTs 11 to 16, diodes D11 to D16, a power supply V0, and a smoothing capacitor C1. The IGBT 11 is a high-side U-phase IGBT while the IGBT 12 is a low-side U-phase IGBT.

The IGBT 13 is a high-side V-phase IGBT while the IGBT 14 is a low-side V-phase IGBT. The IGBT 15 is a high-side W-phase IGBT while the IGBT 16 is a low-side W-phase IGBT.

In the main circuit 10, the load 40 is driven by turning on/off the current of the inductive load, such as a motor. In order to circulate the load current, the diodes D11 to D16, which are free wheeling diodes (FWDs), are connected to the IGBTs 11 to 16.

That is, at the moment when the IGBTs 11 to 16 are turned off, a back electromotive force is generated from the inductive load, such as a motor. Therefore, in order to circulate the load current at this time, the diodes D11 to D16 are connected in anti-parallel to the IGBTs 11 to 16, respectively.

Regarding the connection relationship of each component of the main circuit 10, the positive terminal of the power supply V0 is connected to a first end of the smoothing capacitor C1, collectors of the IGBTs 11, 13, and 15, and cathodes of the diodes D11, D13, and D15. On the other hand, the negative terminal of the power supply V0 is connected to a second end of the smoothing capacitor C1, emitters of the IGBTs 12, 14, and 16, and anodes of the diodes D12, D14, and D16.

The emitter of the IGBT 11 is connected to the anode of the diode D11, the collector of the IGBT 12, the cathode of the diode D12, and an output terminal OUT1. The output terminal OUT1 is connected to the load 40 through the wire a1.

The emitter of the IGBT 13 is connected to the anode of the diode D13, the collector of the IGBT 14, the cathode of the diode D14, and an output terminal OUT2. The output terminal OUT2 is connected to the load 40 through the wire a2.

The emitter of the IGBT 15 is connected to the anode of the diode D15, the collector of the IGBT 16, the cathode of the diode D16, and an output terminal OUT3. The output terminal OUT3 is connected to the load 40 through the wire a3.

The gate of the IGBT 11 is connected to an output terminal H1 of the control circuit 20a while the gate of the IGBT 12 is connected to an output terminal L1 of the control circuit 20a. The gate of the IGBT 13 is connected to an output terminal H2 of the control circuit 20a while the gate of the IGBT 14 is connected to an output terminal L2 of the control circuit 20a. The gate of the IGBT 15 is connected to an output terminal H3 of the control circuit 20a while the gate of the IGBT 16 is connected to an output terminal L3 of the control circuit 20a.

On the other hand, the control circuit 20a includes the input terminals IN1, IN2, and IN3. The control circuit also includes a shift register 21, a high voltage integrated circuit (HVIC) 24, and a low voltage IC (LVIC) 25.

The shift register 21 receives the drive signal SIN sent from the controller 30 via the input terminal IN1. Note that the drive signal SIN is a signal for driving the IGBTs 11 to 16, and is generated inside the controller 30 based on PWM signals.

The shift register 21 also receives the clock signal SCLK sent from the controller 30 via the input terminal IN2, and receives the clock signal RCLK sent from the controller 30 via the input terminal IN3.

The shift register 21 generates gate drive signals HU (high-side U-phase drive signal), HV (high-side V-phase drive signal), and HW (high-side W-phase drive signal) for driving the IGBTs 11, 13, and 15, respectively, based on the drive signal SIN and the clock signals SCLK and RCLK.

Further, the shift register 21 generates gate drive signals LU (low-side U-phase drive signal), LV (low-side V-phase drive signal), and LW (low-side W-phase drive signal) for driving the IGBTs 12, 14, and 16, respectively, based on the drive signal SIN and the clock signals SCLK and RCLK.

The HVIC 24 adjusts the gate drive signals HU, HV, and HW to the levels needed to turn on the IGBTs 11, 13, and 15 during normal operation. Then, the HVIC 24 outputs the adjusted gate drive signal HU toward the gate of the IGBT 11 via the output terminal H1.

The HVIC 24 also outputs the adjusted gate drive signal HV toward the gate of the IGBT 13 via the output terminal H2. Further, the HVIC 24 outputs the adjusted gate drive signal HW toward the gate of the IGBT 15 via the output terminal H3.

The LVIC 25 adjusts the gate drive signals LU, LV, and LW to the levels needed to turn on the IGBTs 12, 14, and 16 during normal operation. Then, the LVIC 25 outputs the adjusted gate drive signal LU toward the gate of the IGBT 12 via the output terminal L1.

The LVIC 25 also outputs the adjusted gate drive signal LV toward the gate of the IGBT 14 via the output terminal L2. Further, the LVIC 25 outputs the adjusted gate drive signal LW toward the gate of the IGBT 16 via the output terminal L3.

<Generation of PWM Signals>

Figure 3:
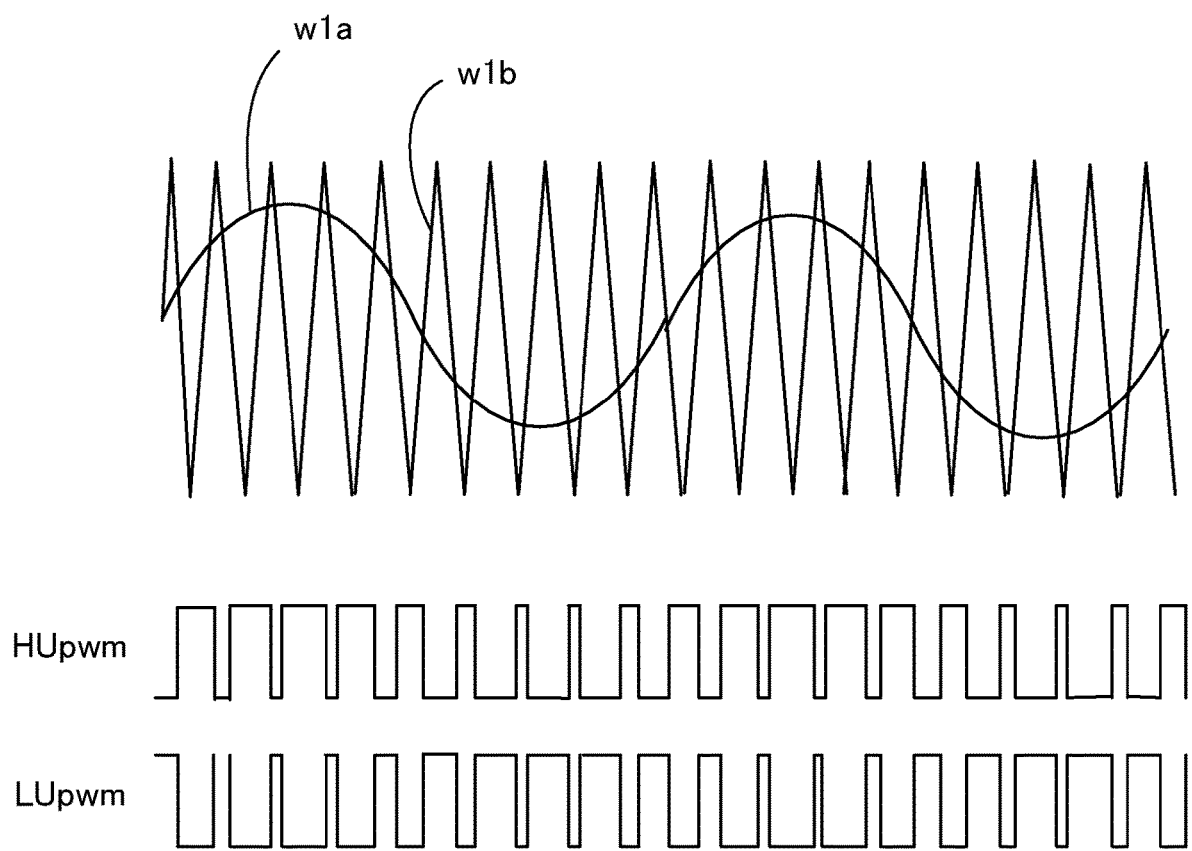
FIG. 3 illustrates an operation example of PWM signal generation.
Figure 4:
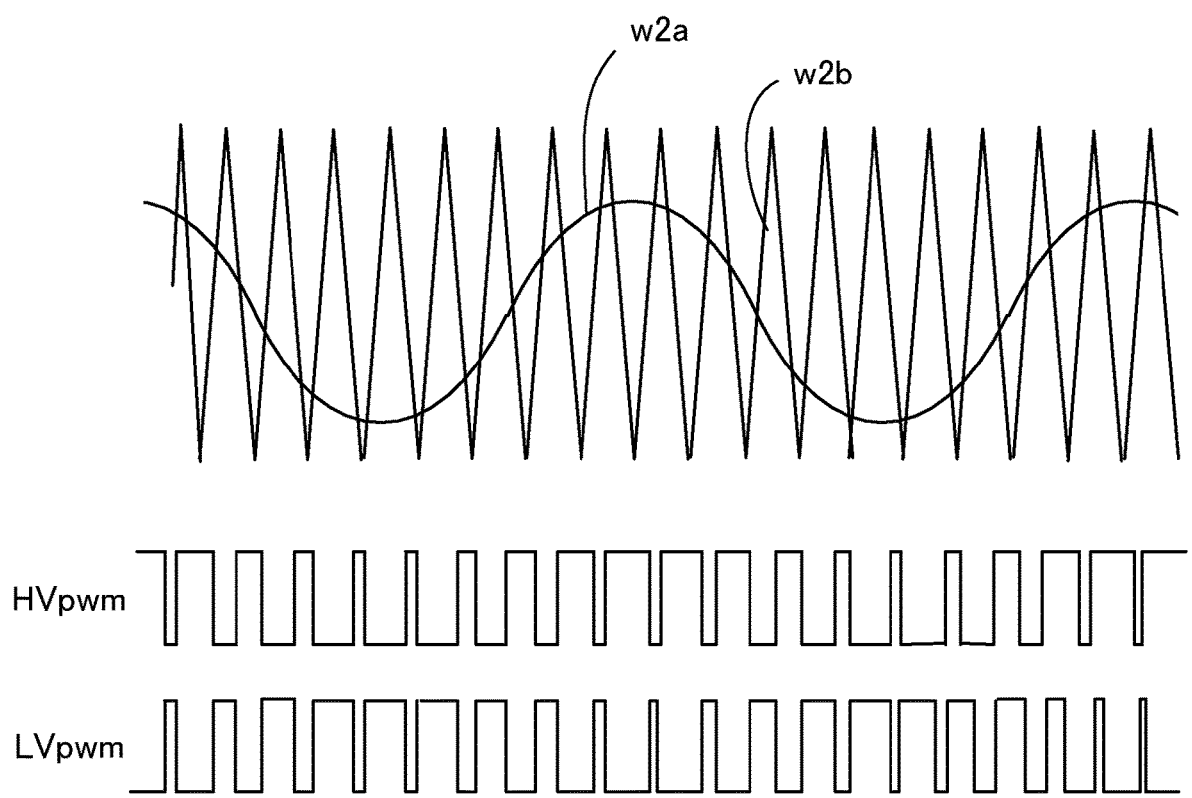
FIG. 4 illustrates another operation example of the PWM signal generation.
Figure 5:
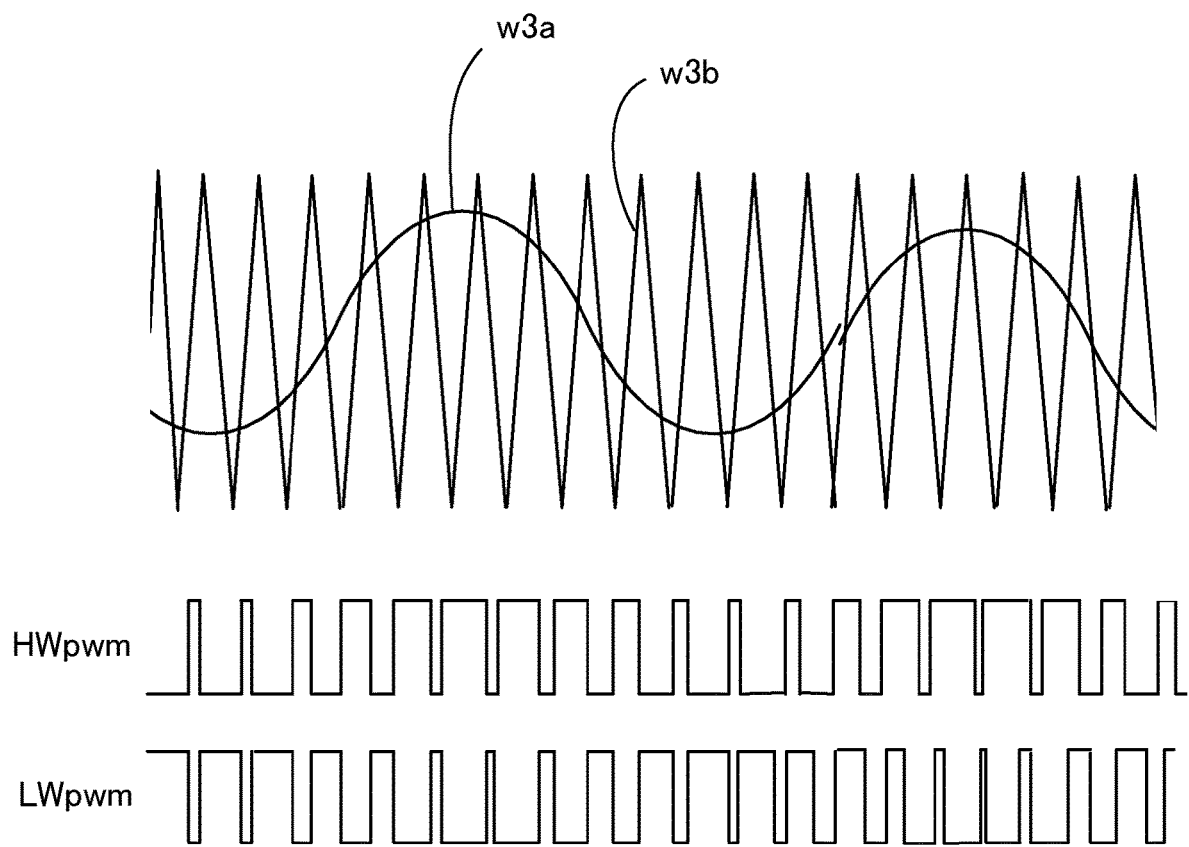
FIG. 5 illustrates yet another operation example of the PWM signal generation.

FIGS. 3 to 5 illustrate operation examples of generation of PWM signals. With reference to FIG. 3, a PWM signal HUpwm for driving the IGBT 11 and a PWM signal LUpwm for driving the IGBT 12 are generated inside the controller 30 from a sine wave w1a and a triangular wave w1b.

With reference to FIG. 4, a PWM signal HVpwm for driving the IGBT 13 and a PWM signal LVpwm for driving the IGBT 14 are generated inside the controller 30 from a sine wave w2a and a triangular wave w2b.

With reference to FIG. 5, a PWM signal HWpwm for driving the IGBT 15 and a PWM signal LWpwm for driving the IGBT 16 are generated inside the controller 30 from a sine wave w3a and a triangular wave w3b.

The controller 30 synthesizes the six PWM signals illustrated in FIGS. 3 to 5 to generate the drive signal SIN, and then outputs the drive signal SIN.

<Configuration of Shift Register>

Figure 6:
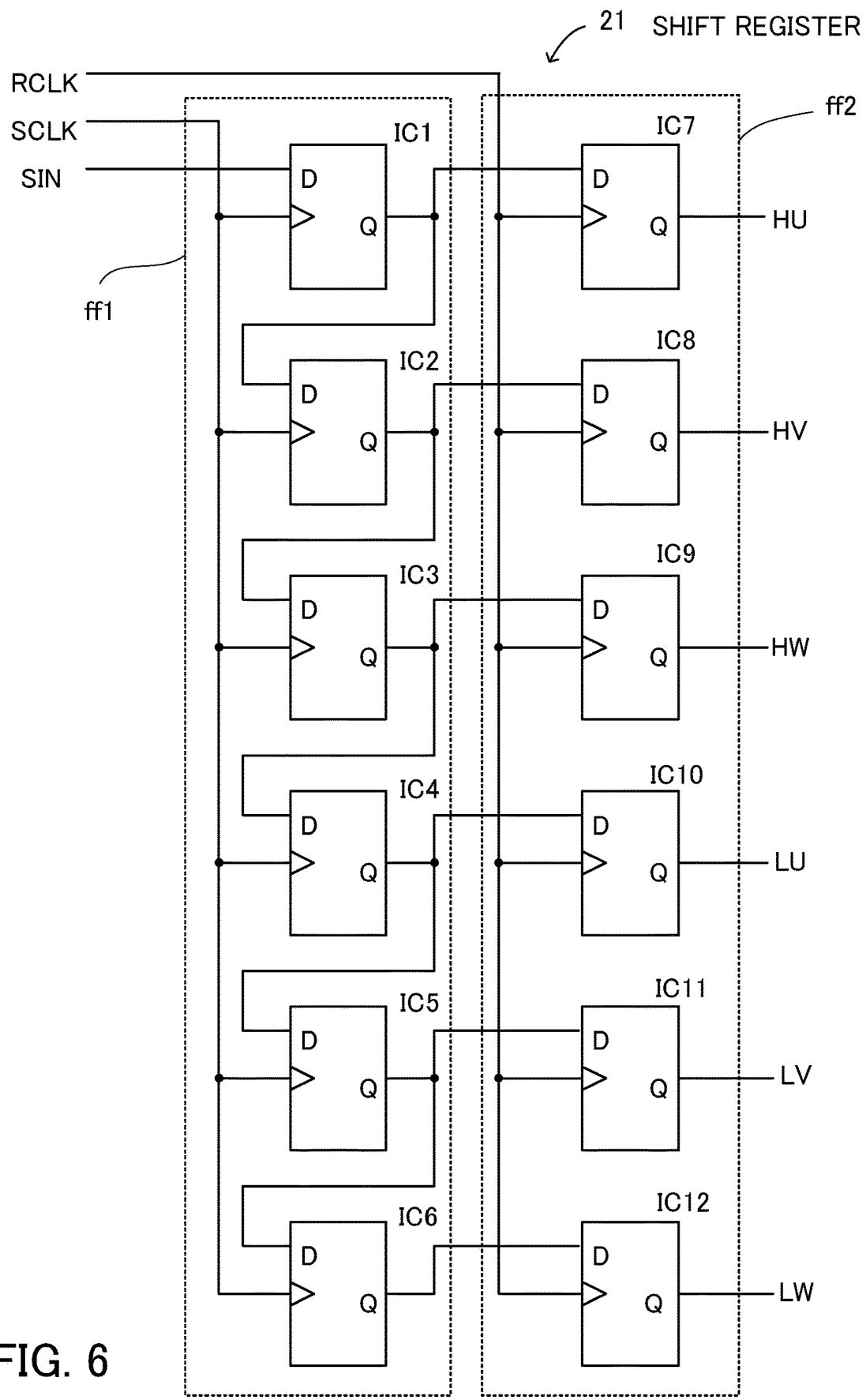
FIG. 6 illustrates a configuration example of a shift register.

FIG. 6 illustrates a configuration example of a shift register. The shift register 21 includes an input-side flip-flop group ff1 and an output-side flip-flop group ff2. The input-side flip-flop group ff1 includes D flip-flops IC1 to IC6, and holds the drive signal SIN according to the clock signal SCLK. The output-side flip-flop group ff2 outputs parallel signals (the gate drive signals HU, HV, and HW and the gate drive signals LU, LV, and LW) according to the clock signal RCLK.

The clock signal SCLK is input to individual clock input terminals of the D flip-flops IC1 to IC6. The clock signal RCLK is input to individual clock input terminals of the D flip-flops IC7 to IC12.

The drive signal SIN is input to an input terminal D of the D flip-flop IC1. An output terminal Q of the D flip-flop IC1 is connected to the input terminal D of the D flip-flop IC2 and the input terminal D of the D flip-flop IC7.

The output terminal Q of the D flip-flop IC2 is connected to the input terminal D of the D flip-flop IC3 and the input terminal D of the D flip-flop IC8. The output terminal Q of the D flip-flop IC3 is connected to the input terminal D of the D flip-flop IC4 and the input terminal D of the D flip-flop IC9.

The output terminal Q of the D flip-flop IC4 is connected to the input terminal D of the D flip-flop IC5 and the input terminal D of the D flip-flop IC10. The output terminal Q of the D flip-flop IC5 is connected to the input terminal D of the D flip-flop IC6 and the input terminal D of the D flip-flop IC11. The output terminal Q of the D flip-flop IC6 is connected to the input terminal D of the D flip-flop IC12.

The output terminal Q of the D flip-flop IC7 outputs the gate drive signal HU for driving the IGBT 11. The output terminal Q of the D flip-flop IC8 outputs the gate drive signal HV for driving the IGBT 13. The output terminal Q of the D flip-flop IC9 outputs the gate drive signal HW for driving the IGBT 15. The gate drive signals HU, HV, and HW correspond to the PWM signals HUpwm, HVpwm, and HWpwm, respectively, and are output to the HVIC 24.

Further, the output terminal Q of the D flip-flop IC10 outputs the gate drive signal LU for driving the IGBT 12. The output terminal Q of the D flip-flop IC11 outputs the gate drive signal LV for driving the IGBT 14. The output terminal Q of the D flip-flop IC12 outputs the gate drive signal LW for driving the IGBT 16. The gate drive signals LU, LV, and LW correspond to the PWM signals LUpwm, LVpwm, and LWpwm, respectively, and are output to the LVIC 25.

<Timing Chart of Shift Register>

Figure 7:
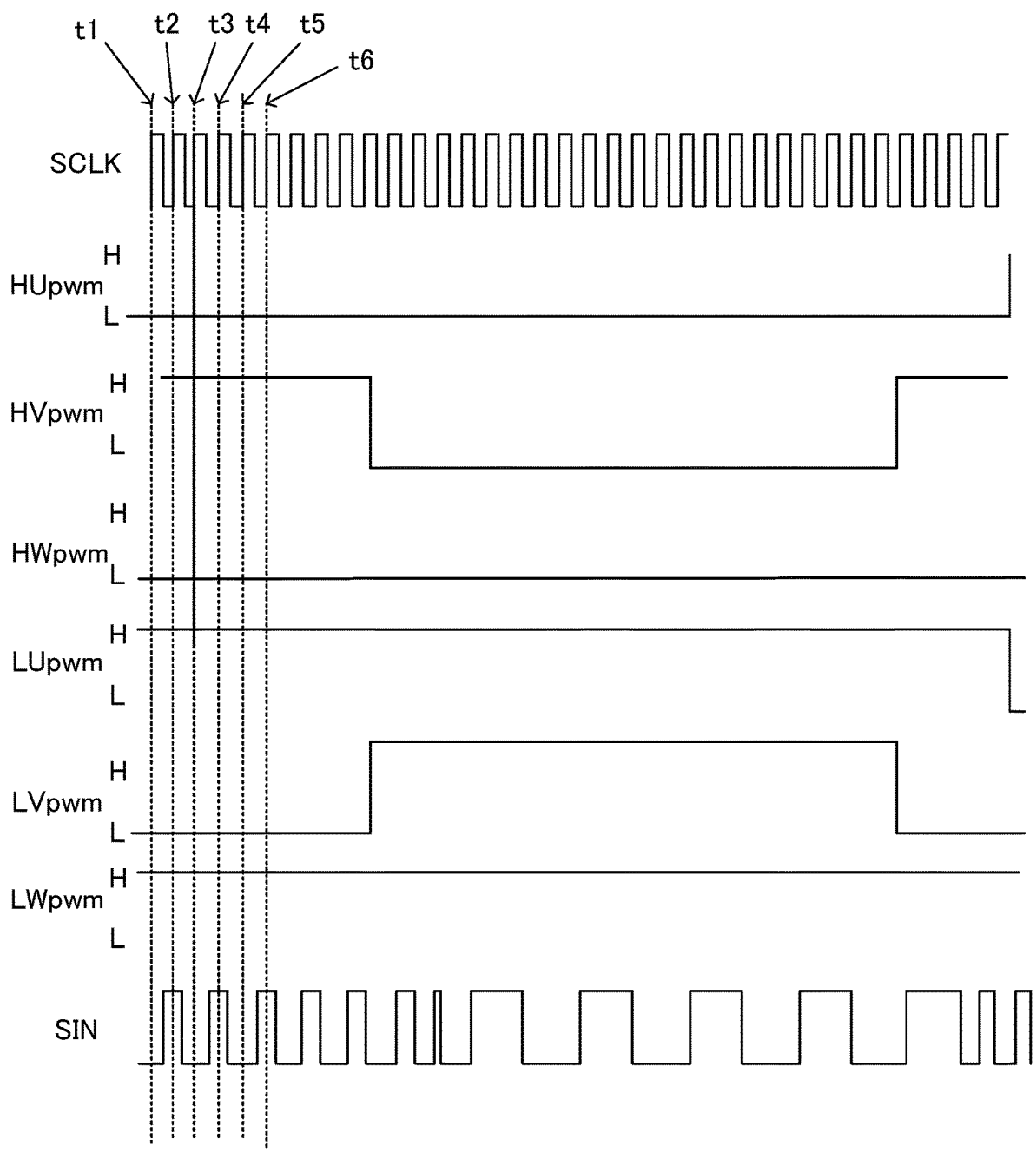
FIG. 7 illustrates an example of a timing chart of input-side signals of the shift register.

FIG. 7 illustrates an example of a timing chart of input-side signals of a shift register. Note that FIG. 7 also depicts waveforms of the PWM signals HUpwm, HVpwm, and HWpwm and waveforms of the PWM signals LUpwm, LVpwm, and LWpwm generated inside the controller 30. The shift register 21 holds the drive signal SIN according to the clock signal SCLK.

[Timing t1] At the rise of the clock signal SCLK, the drive signal SIN is held low ("L"). The "L" level held at this time corresponds to the "L" level of the PWM signal HUpwm.

[Timing t2] At the rise of the clock signal SCLK, the drive signal SIN is held high ("H"). The "H" level held at this time corresponds to the "H" level of the PWM signal HVpwm.

[Timing t3] At the rise of the clock signal SCLK, the drive signal SIN is held low ("L"). The "L" level held at this time corresponds to the "L" level of the PWM signal HWpwm.

[Timing t4] At the rise of the clock signal SCLK, the drive signal SIN is held high ("H"). The "H" level held at this time corresponds to the "H" level of the PWM signal LUpwm.

[Timing t5] At the rise of the clock signal SCLK, the drive signal SIN is held low ("L"). The "L" level held at this time corresponds to the "L" level of the PWM signal LVpwm.

[Timing t6] At the rise of the clock signal SCLK, the drive signal SIN is held high ("H"). The "H" level held at this time corresponds to the "H" level of the PWM signal LWpwm. Thereafter, in a similar fashion, the drive signal SIN is held by the shift register 21 according to the clock signal SCLK.

Figure 8:
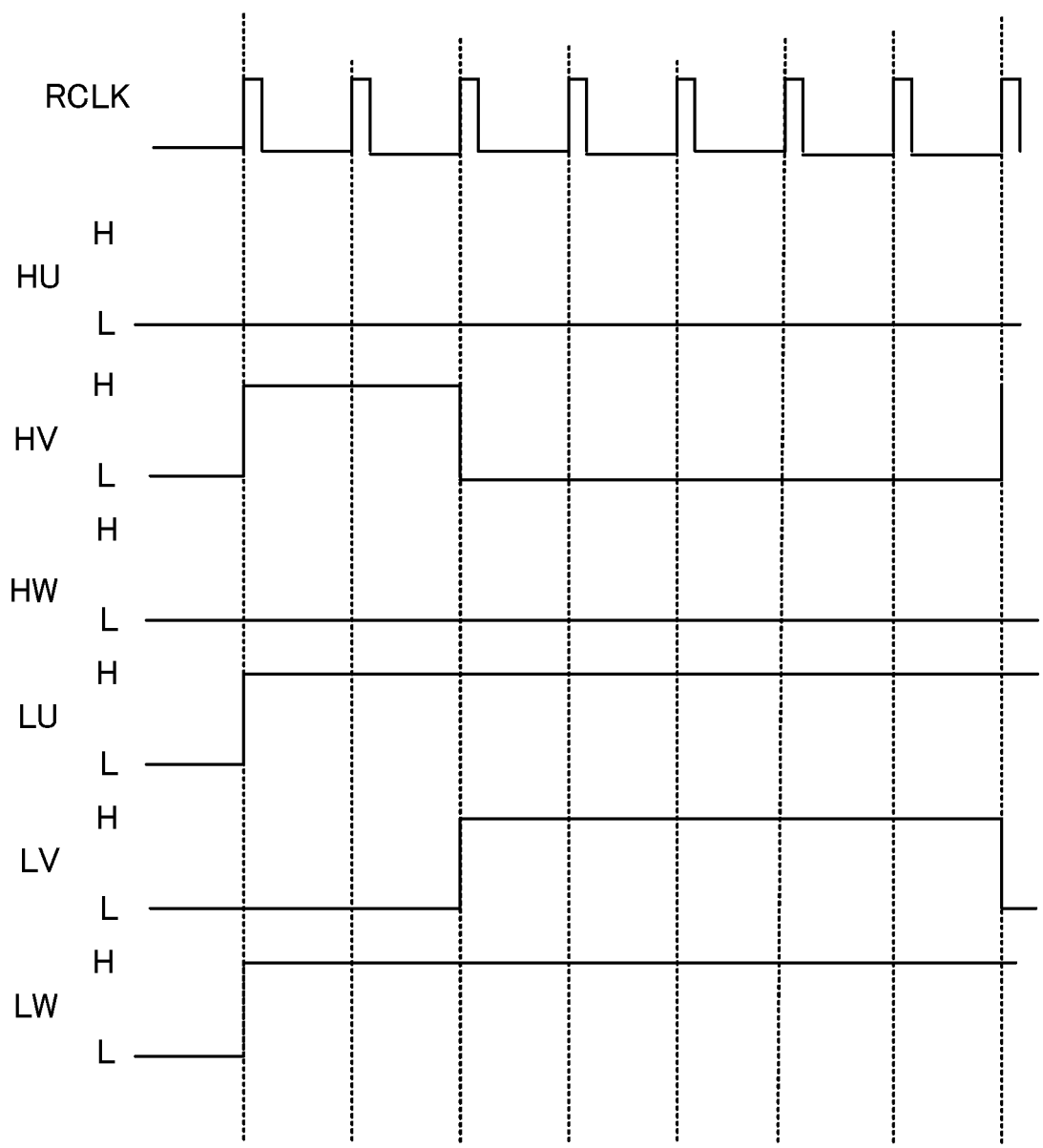
FIG. 8 illustrates an example of a timing chart of output-side signals of the shift register.

FIG. 8 illustrates an example of a timing chart of output-side signals of a shift register. The shift register 21 converts the serial drive signal SIN into parallel gate drive signals and outputs them according to the clock signal RCLK. The main circuit 10 includes six IGBTs, and the shift register 21 outputs the updated gate drive signals every six counts of the clock signal SCLK. Therefore, one pulse of the clock signal RCLK appears at every sixth count of the clock signal SCLK.

Now referring back to FIG. 6, the D flip-flop IC7 outputs the gate drive signal HU (the PWM signal HUpwm); the D flip-flop IC8 outputs the gate drive signal HV (the PWM signal HVpwm); and the D flip-flop IC9 outputs the gate drive signal HW (the PWM signal HWpwm).

In addition, the D flip-flop IC10 outputs the gate drive signal LU (the PWM signal LUpwm); the D flip-flop IC11 outputs the gate drive signal LV (the PWM signal LVpwm); and the D flip-flop IC12 outputs the gate drive signal LW (the PWM signal LWpwm).

As described above, the semiconductor device 1-1 receives the drive signal SIN obtained by serializing PWM signals for driving the IGBTs 11 to 16, the clock signal SCLK for holding the drive signal SIN, and the clock signal RCLK for parallelizing the drive signal SIN to output the gate drive signals. The semiconductor device 1-1 then converts the serial drive signal SIN into the parallel signals (the six gate drive signals) to generate the PWM signals for driving the IGBTs 11 to 16.

This configuration allows a reduction in the number of input pins needed from six to three. Thus, it is possible to reduce the number of pins in a package without removal of existing functions. Furthermore, the reduction in the number of pins needed makes it possible to assign other functions to the extra pins.

<Semiconductor Device #1 with Number of Input Pins Reduced from 6 to 2>

Figure 9:
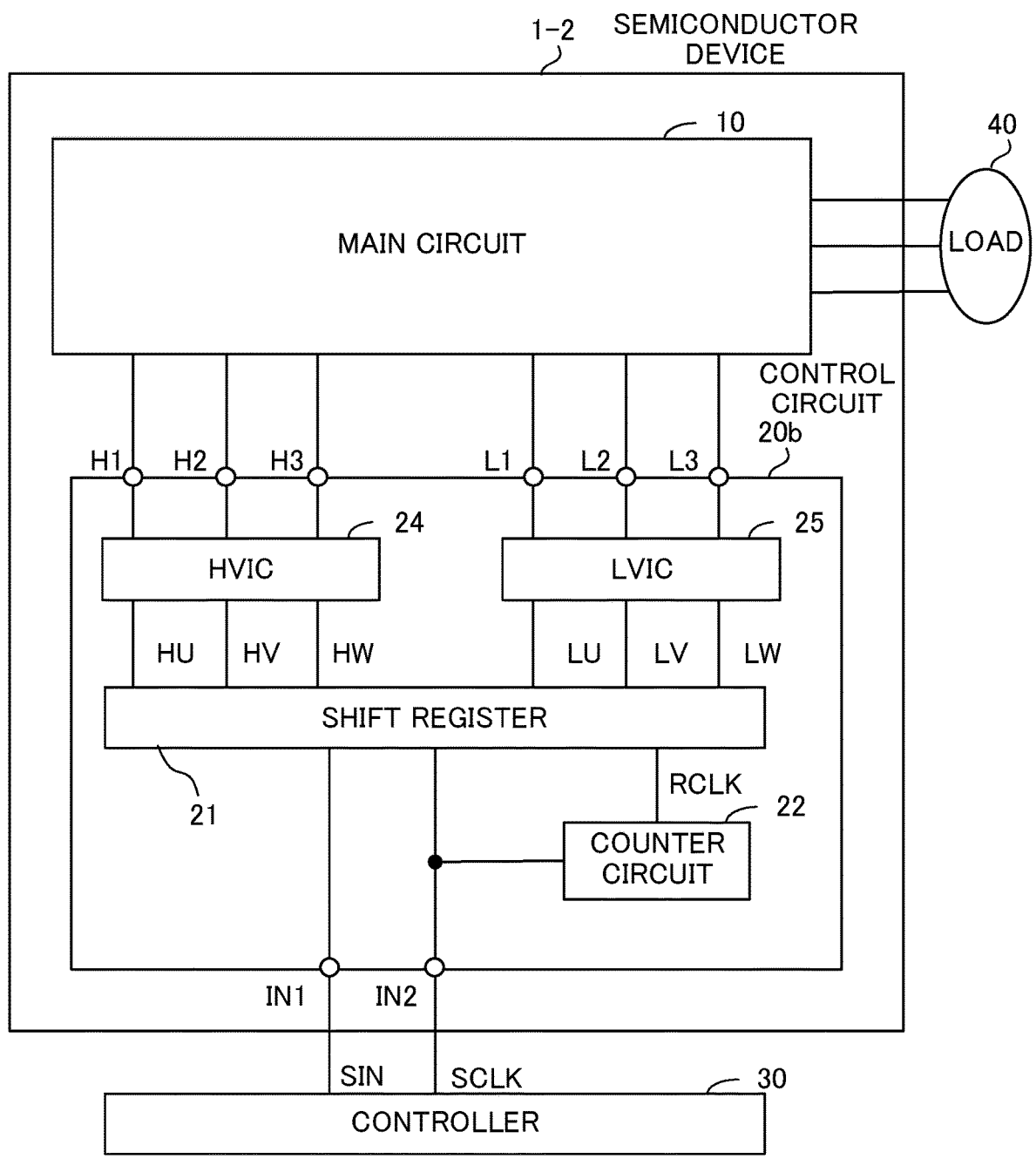
FIG. 9 illustrates a configuration example of a yet another semiconductor device.

Next described is a semiconductor device including a counter circuit, with the number of input pins reduced from six to two. FIG. 9 illustrates a configuration example of a semiconductor device. A semiconductor device 1-2 includes the main circuit 10 and a control circuit 20b.

The control circuit 20b has, as input and output terminals, the input terminals IN1 and IN2 and the output terminals H1 to H3 and L1 to L3. The control circuit 20b also has the shift register 21, a counter circuit 22, the HVIC 24, and the LVIC 25. The semiconductor device 1-2 differs from the semiconductor device 1-1 of FIG. 2 in that the control circuit 20b includes the counter circuit 22 but does not have the input terminal IN3. The rest of the configuration is the same as in FIG. 2.

<Operation of Counter Circuit>

Figure 10:
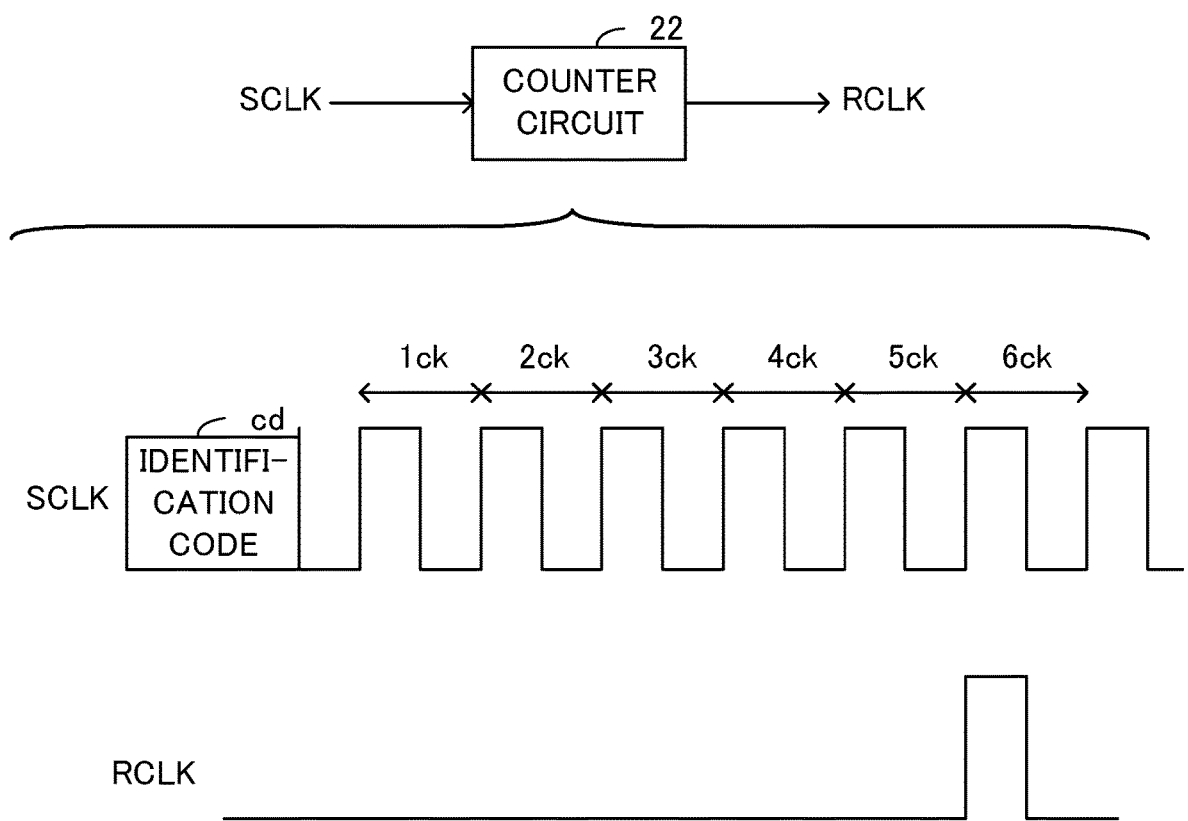
FIG. 10 illustrates operation of a counter circuit.

FIG. 10 illustrates operation of a counter circuit. The counter circuit 22 receives the clock signal SCLK input via the input terminal IN2. Note that the clock signal SCLK here has an identification code cd generated by the controller 30.

The identification code cd is a several-bit encoded code that triggers the start of counting operation. When recognizing the identification code cd, the counter circuit 22 counts, for example, 6 clocks after a predetermined number of bits has passed following the recognition of the identification code cd, and generates and outputs a pulse of the clock signal RCLK at the 6th clock (one pulse of the clock signal RCLK is output when the clock signal SCLK is counted six times). Thereafter, in the same manner, one pulse of the clock signal RCLK is generated and output every sixth clock of the clock signal SCLK.

As described above, the semiconductor device 1-2 receives the drive signal SIN obtained by serializing PWM signals for driving the IGBTs 11 to 16 and the clock signal SCLK for holding the drive signal SIN, and internally generates the clock signal RCLK from the clock signal SCLK. The semiconductor device 1-2 then converts the serial drive signal SIN into parallel signals (six gate drive signals) to generate the PWM signals for driving the IGBT 11 to 16.

This configuration allows a reduction in the number of input pins needed from six to two. Thus, it is possible to reduce the number of pins in a package without removal of existing functions. Furthermore, the reduction in the number of pins needed makes it possible to assign other functions to the extra pins.

<Semiconductor Device #2 with Number of Input Pins Reduced from 6 to 2>

Figure 11:
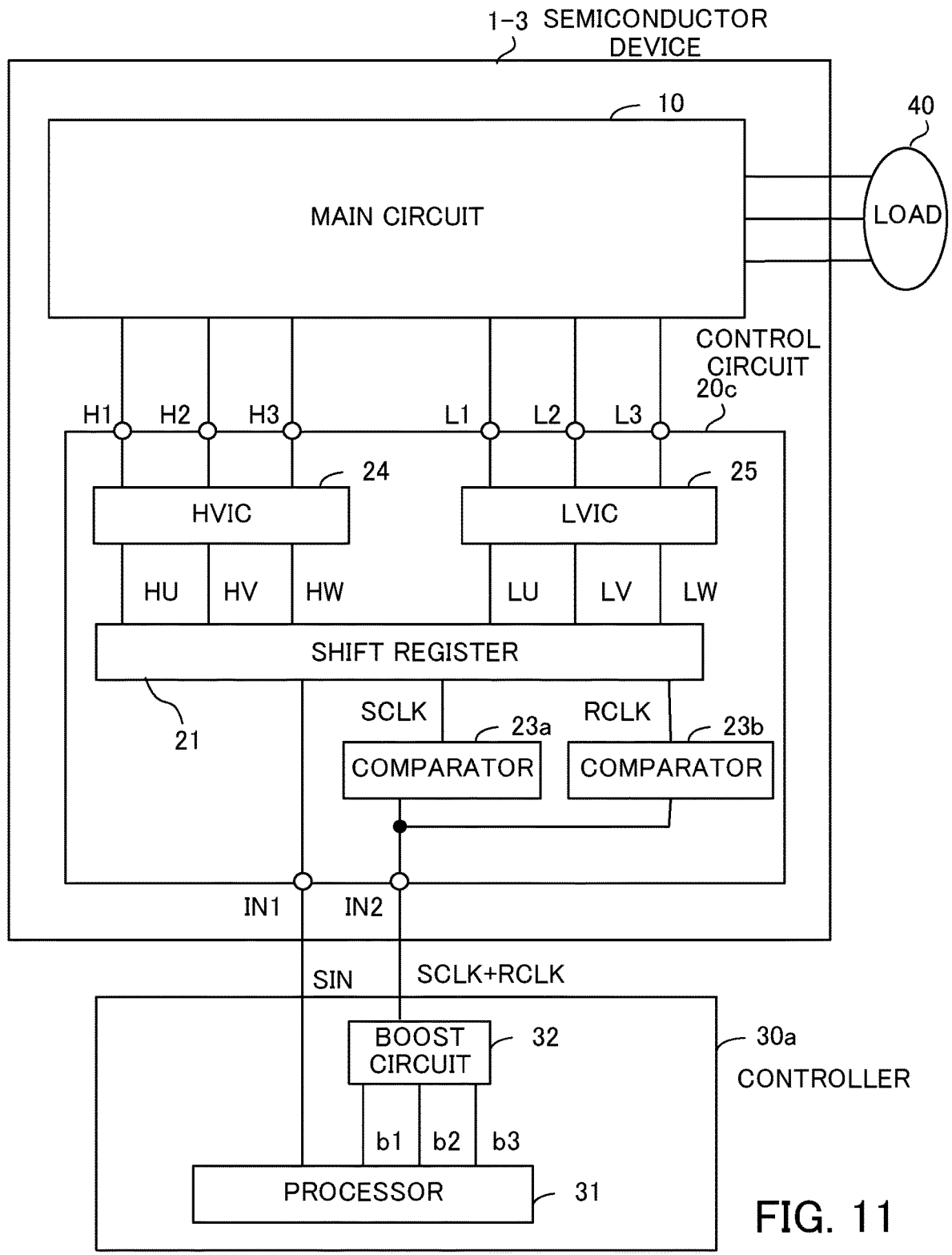
FIG. 11 illustrates a configuration example of a yet another semiconductor device.

Next described is a semiconductor device including comparators, with the number of input pins reduced from six to two. FIG. 11 illustrates a configuration example of a semiconductor device. A semiconductor device 1-3 includes the main circuit 10 and a control circuit 20c. The control circuit has, as input and output terminals, the input terminals IN1 and IN2 and the output terminals H1 to H3 and L1 to L3. The control circuit 20c also includes the shift register 21, a comparator 23a (first comparator), a comparator 23b (second comparator), the HVIC 24, and the LVIC 25.

The semiconductor device 1-3 differs from the semiconductor device 1-1 of FIG. 2 in that, unlike the control circuit 20a, the control circuit 20c includes the comparators 23a and 23b but does not have the input terminal IN3. On the other hand, a controller 30a includes a processor 31 and a boost circuit 32, and the processor 31 outputs switching control signals b1, b2, and b3 to the boost circuit 32. The rest of the configuration is the same as in FIG. 2.

<Configuration of Boost Circuit>

Figure 12:
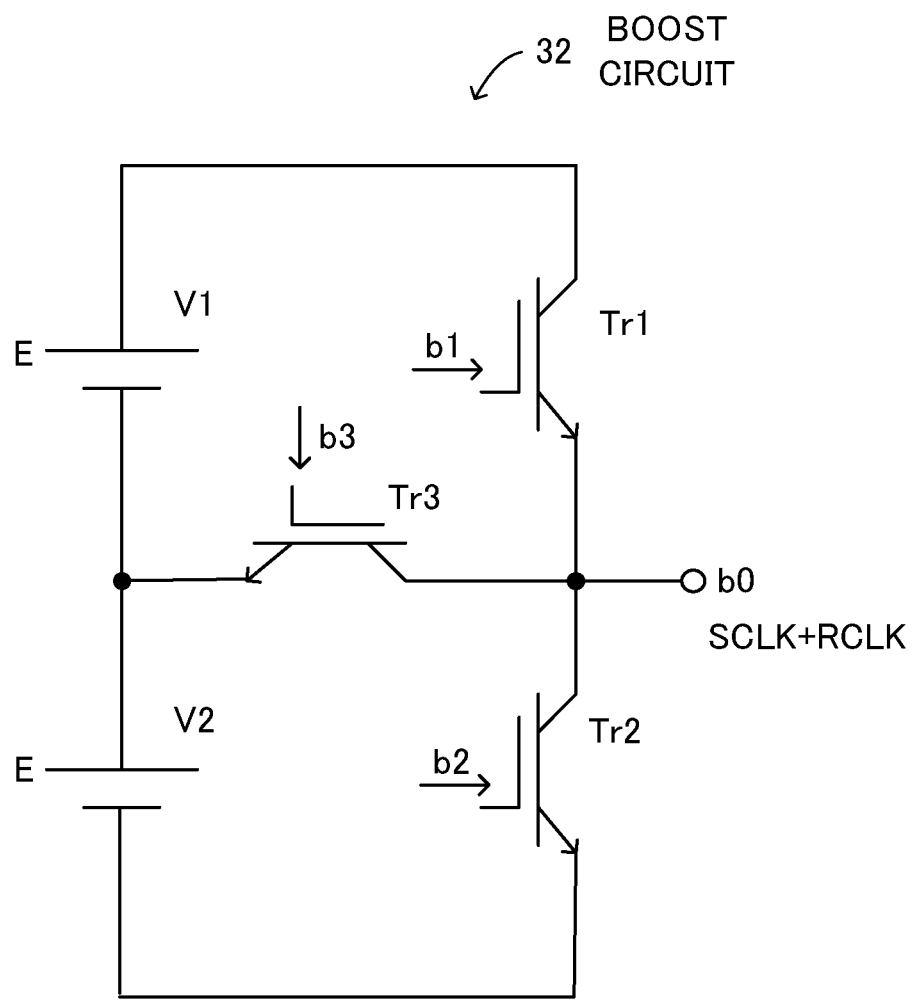
FIG. 12 illustrates a configuration example of a boost circuit.

FIG. 12 illustrates a configuration example of a boost circuit. The boost circuit 32 includes transistors Tr1, Tr2, and Tr3 and power supplies V1 and V2 connected in series. The transistors Tr1, Tr2, and Tr3 are NPN transistors. Assume here that the power supplies V1 and V2 both output E [V].

The positive terminal of the power supply V1 is connected to the collector of the transistor Tr1, and the emitter of the transistor Tr1 is connected to the collector of the transistor Tr2, the collector of the transistor Tr3, and an output terminal b0. The output terminal b0 outputs a composite clock signal SCLK+RCLK. The emitter of the transistor Tr2 is connected to the negative terminal of the power supply V2.

The positive terminal of the power supply V2 is connected to the negative terminal of the power supply V1 and the emitter of the transistor Tr3. Note that the switching control signals b1, b2, and b3 sent from the processor 31 are input to the bases of the transistors Tr1, Tr2, and Tr3, respectively.

<Operation of Boost Circuit and Generation of Clock Signals>

Figure 13:
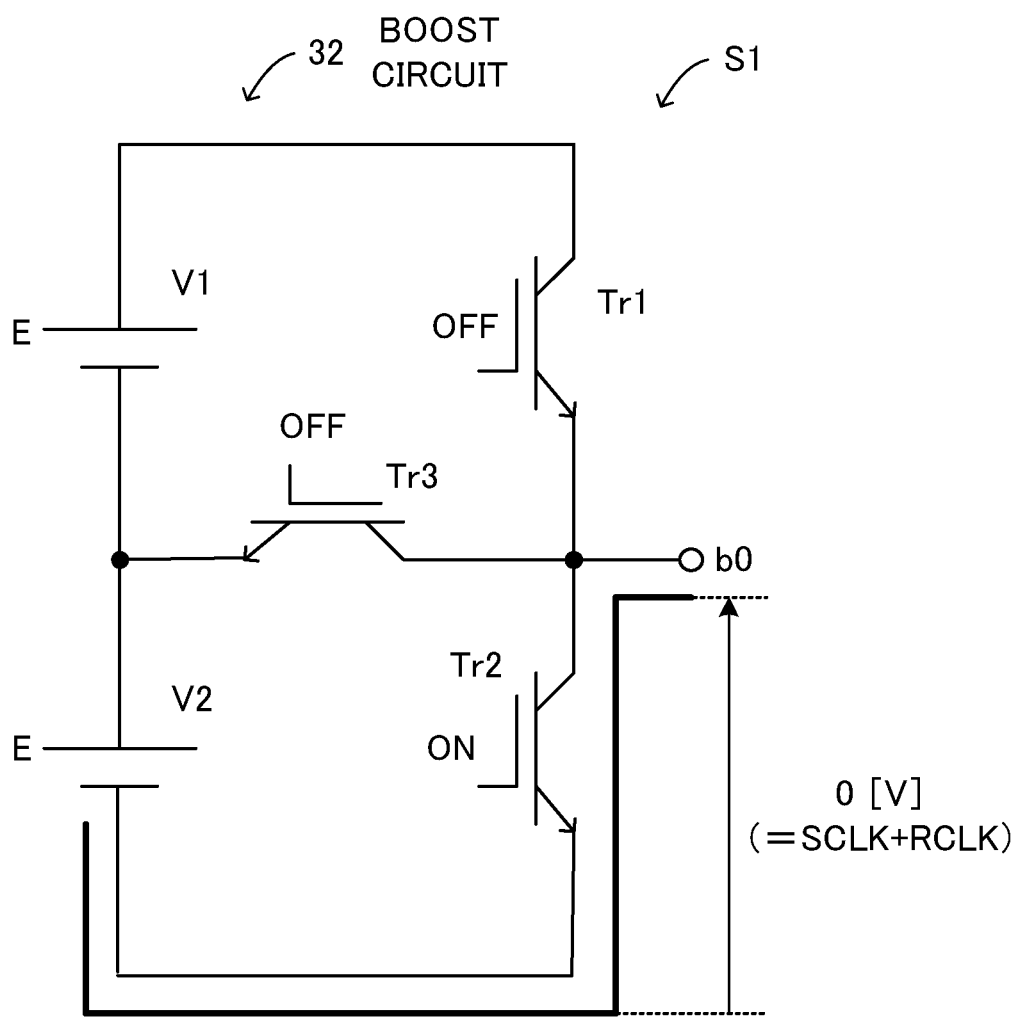
FIG. 13 is a first diagram illustrating operation of the boost circuit.
Figure 14:
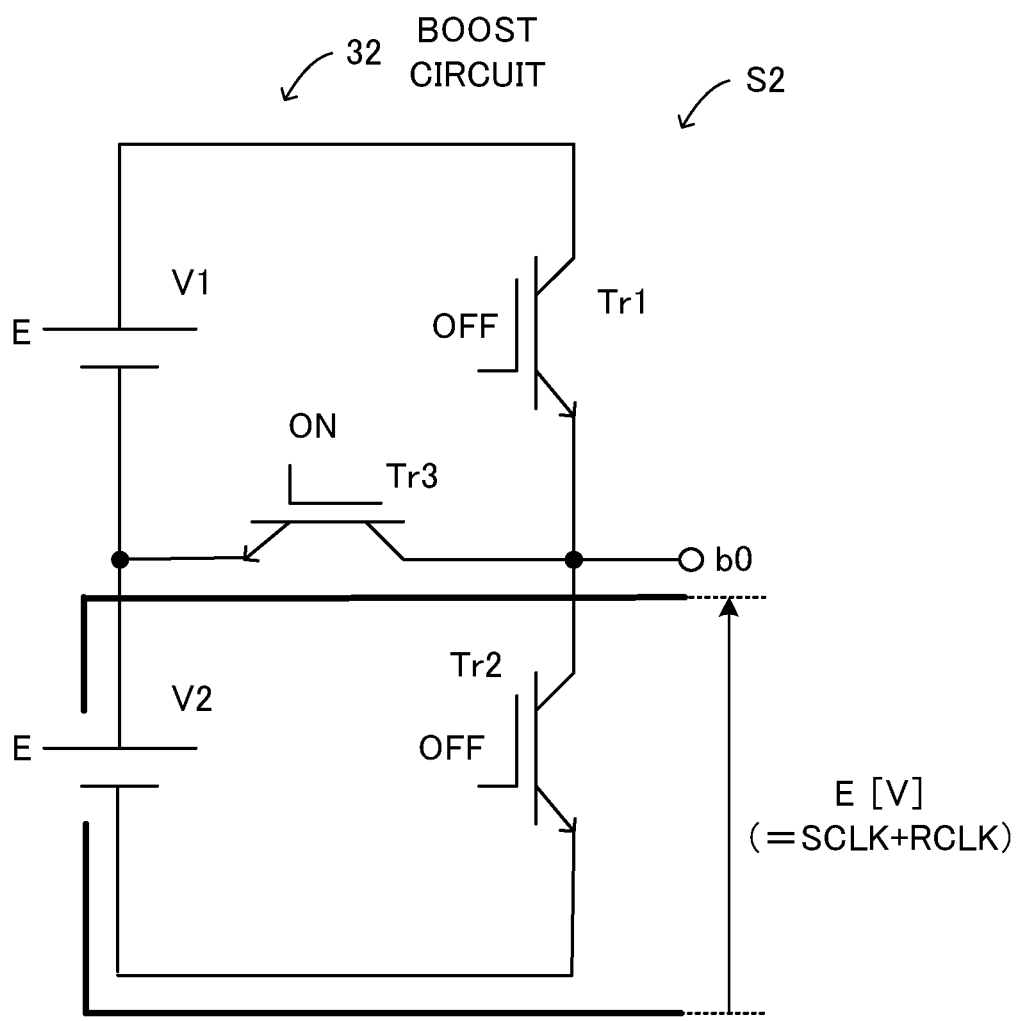
FIG. 14 is a second diagram illustrating the operation of the boost circuit.
Figure 15:
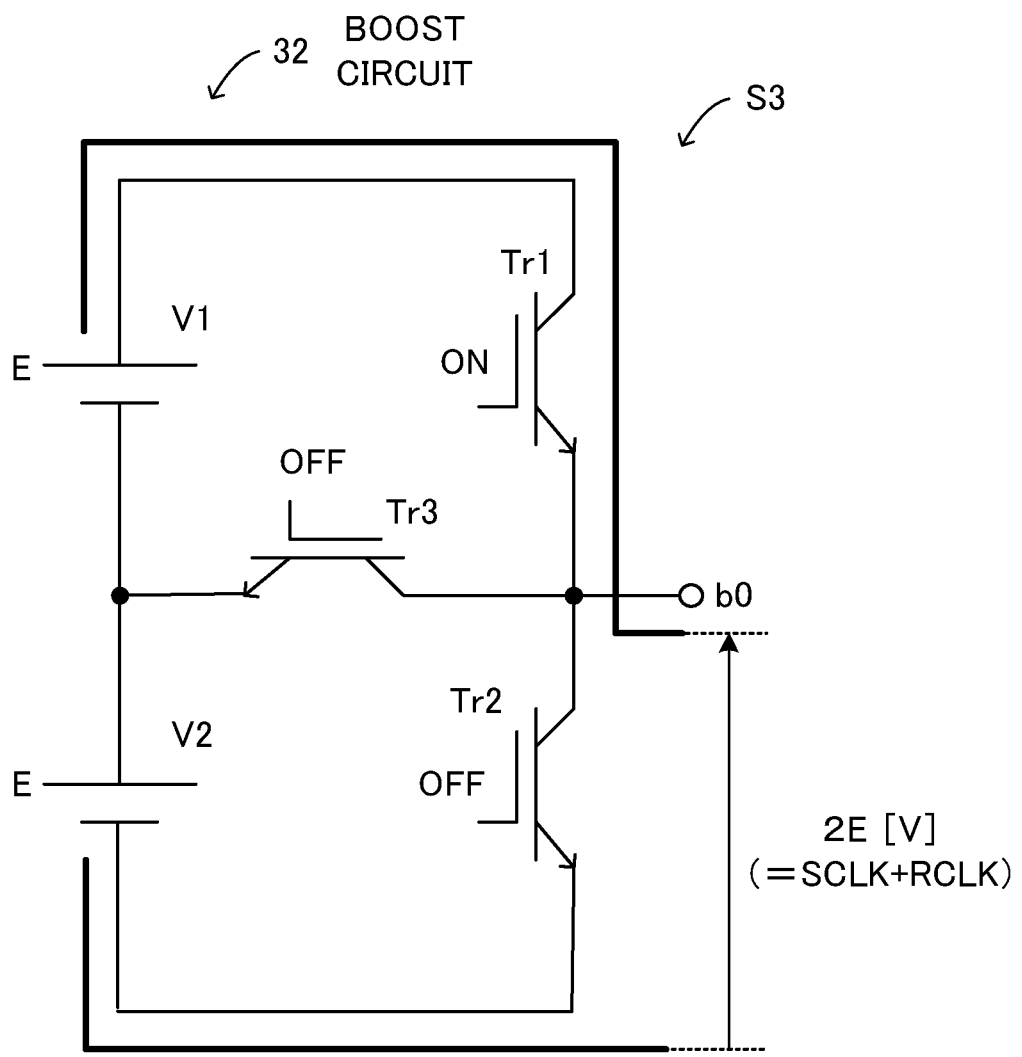
FIG. 15 is a third diagram illustrating the operation of the boost circuit.

FIGS. 13 to 15 illustrate operation of a boost circuit.

[Step S1] According to the switching control signals b1, b2, and b3 sent from the processor 31 and then input to the bases of the transistors Tr1, Tr2, and Tr3, respectively, of the boost circuit 32, the transistor Tr1 is turned off, the transistor Tr2 is turned on, and the transistor Tr3 is turned off, as illustrated in FIG. 13.

At this time, the voltage between the output terminal b0 and the negative terminal of the power supply V2 (the emitter of the transistor Tr2) is 0 [V]. Therefore, the composite clock signal SCLK+RCLK is 0 [V].

[Step S2] According to the switching control signals b1, b2, and b3 sent from the processor 31 and then input to the bases of the transistors Tr1, Tr2, and Tr3, respectively, of the boost circuit 32, the transistor Tr1 is turned off, the transistor Tr2 is turned off, and the transistor Tr3 is turned on, as illustrated in FIG. 14.

At this time, the voltage between the output terminal b0 and the negative terminal of the power supply V2 is E [V] supplied from the power supply V2. Therefore, the composite clock signal SCLK+RCLK is E [V].

[Step S3] After a predetermined period of time has elapsed from the start of the control in step S2, the transistor Tr1 is turned on, the transistor Tr2 is turned off, and the transistor Tr3 is turned off, as illustrated in FIG. according to the switching control signals b1, b2, and b3 sent from the processor 31 and then input to the bases of the transistors Tr1, Tr2, and Tr3, respectively, of the boost circuit 32.

At this time, the voltage between the output terminal b0 and the negative terminal of the power supply V2 is 2E [V], which is the sum of E [V] supplied from the power supply V1 and E [V] supplied from the power supply V2. Therefore, the composite clock signal SCLK+RCLK is 2E [V].

Figure 16:
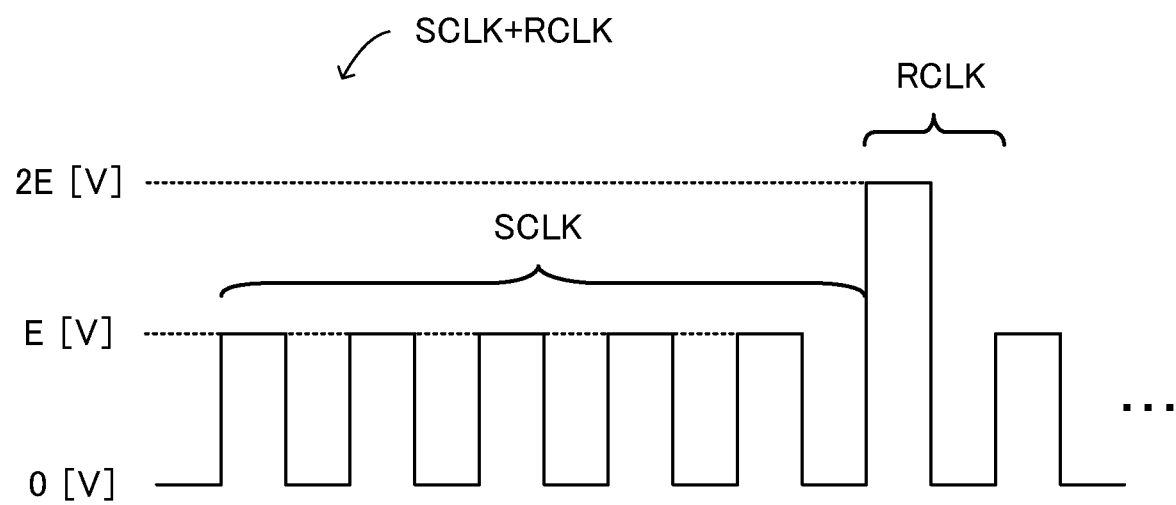
FIG. 16 illustrates a composite clock signal output from the boost circuit.

FIG. 16 illustrates a composite clock signal output from a boost circuit. In step S1 of FIG. 13, because the voltage between the output terminal b0 and the negative terminal of the power supply V2 is 0 [V], the composite clock signal SCLK+RCLK is 0 [V].

In step S2 of FIG. 14, because the voltage between the output terminal b0 and the negative terminal of the power supply V2 is E [V] supplied from the power supply V2, the composite clock signal SCLK+RCLK is E [V]. The composite clock signal SCLK+RCLK at E[V] corresponds to the clock signal SCLK.

In step S3 of FIG. 15, because the voltage between the output terminal b0 and the negative terminal of the power supply V2 is 2E [V], which is the sum of E [V] supplied from the power supply V1 and E [V] supplied from the power supply V2, the composite clock signal SCLK+RCLK is 2E [V]. The composite clock signal SCLK+RCLK at 2E [V] corresponds to the clock signal RCLK.

As described above, the clock amplitude from the first clock to the fifth clock is set to E [V], to thereby set the clock signal from the first clock to the fifth clock to the clock signal SCLK. Then, the clock amplitude of the sixth clock is raised to 2E [V], to thereby set the sixth clock signal to the clock signal RCLK. That is, the clock signal RCLK is obtained by boosting the first level of every n-th pulse of the clock signal SCLK to the second level (n being a natural number that is greater than two). In this embodiment, n is five. With such a configuration of the boost circuit 32, the composite clock signal SCLK+RCLK is generated.

<Configurations and Operation of Comparators>

Figure 17:
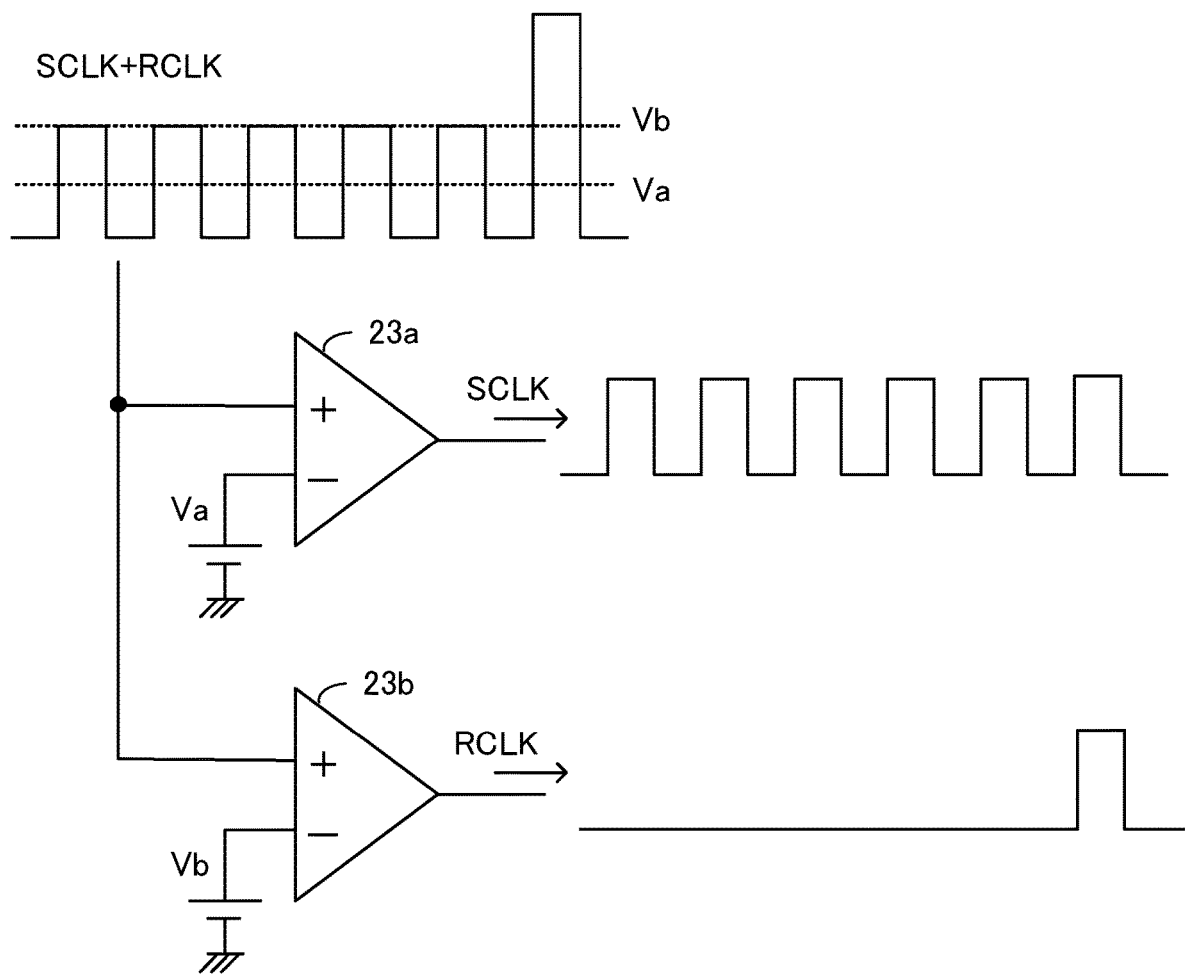
FIG. 17 illustrates configurations and operation of comparators.

FIG. 17 illustrates configurations and operation of comparators. The composite clock signal SCLK+RCLK is input to individual non-inverting input terminals (+) of the comparators 23a and 23b.

A reference voltage Va is applied to the inverting input terminal (−) of the comparator 23a while a reference voltage Vb is applied to the inverting input terminal (−) of the comparator 23b. Note that Vb is greater than Va (Va<Vb). Then, the clock signal SCLK is output from the output terminal of the comparator 23a, and the clock signal RCLK is output from the output terminal of the comparator 23b.

In this configuration, the comparator 23a outputs the clock signal SCLK when the level of the composite clock signal SCLK+RCLK is higher than the reference voltage Va and lower than the reference voltage Vb. The comparator 23b outputs the clock signal RCLK when the level of the composite clock signal SCLK+RCLK is higher than the reference voltage Vb.

As described above, the semiconductor device 1-3 receives the drive signal SIN obtained by serializing PWM signals for driving the IGBTs 11 to 16 and the composite clock signal SCLK+RCLK obtained by synthesizing the clock signal SCLK for holding the drive signal SIN and the clock signal RCLK for generating parallel gate drive signals from the drive signal SIN.

Then, the composite clock signal SCLK+RCLK is separated into the clock signal SCLK and the clock signal RCLK inside the control circuit 20c, and the serial drive signal SIN is converted into parallel signals (six gate drive signals) to generate the PWM signals for driving the IGBTs 11 to 16.

This configuration allows a reduction in the number of input pins needed from six to two. Thus, it is possible to reduce the number of pins in a package without removal of existing functions. Furthermore, the reduction in the number of pins needed makes it possible to assign other functions to the extra pins.

While, as described above, the embodiments have been exemplified, the configurations of individual portions illustrated in the embodiments may be replaced with others having the same functions. In addition, other constituent elements or processes may be added thereto. Furthermore, two or more compositions (features) of the embodiments may be combined together.

According to one aspect, it is possible to reduce the number of pins used while maintaining existing functions.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a main circuit including a plurality of series circuits connected in parallel with one another, each series circuit including a high-side switching element and a low-side switching element connected in series and having a connection point therebetween, the main circuit being configured to supply electric power to a load through respective wires connected to the connection points of the plurality of series circuits; and
   a control circuit including first through third input terminals and a plurality of output terminals, the control circuit being configured to receive, through the first through third input terminals, respectively, a serial drive signal, a first clock signal, and a second clock signal, the control circuit further including a shift register having an input-side flip-flop group configured to receive the serial drive signal, and an output-side flip-flop group configured to output a plurality of parallel drive signals, wherein
   the input-side flip-flop group includes a plurality of input-side flip-flops sequentially connected to one another, and the output-side flip-flop group includes a plurality of output-side flip-flops respectively connected to corresponding ones of the input-side flip-flops, such that:
   (i) in response to the first clock signal, each input-side flip-flop provides its input data to the next input-side flip-flop and outputs the input data to a corresponding output-side flip-flop; and
   (ii) in response to the second clock signal, respective output-side flip-flops output corresponding data as the plurality of parallel drive signals through respective ones of the plurality of output terminals to corresponding ones of the high-side switching elements and the low-side switching elements.

2. The semiconductor device according to claim 1, wherein:
the high-side switching elements in the plurality of series circuits include a high-side U-phase switch, a high-side V-phase switch, and a high-side W-phase switch, and the low-side switching elements in the plurality of series circuits include a low-side U-phase switch, a low-side V-phase switch, and a low-side W-phase switch, and
the parallel drive signals generated by the control circuit include a high-side U-phase drive signal which is input to a gate of the high-side U-phase switch, a high-side V-phase drive signal which is input to a gate of the high-side V-phase switch, a high-side W-phase drive signal which is input to a gate of the high-side W-phase switch, a low-side U-phase drive signal which is input to a gate of the low-side U-phase switch, a low-side V-phase drive signal which is input to a gate of the low-side V-phase switch, and a low-side W-phase drive signal which is input to a gate of the low-side W-phase switch.

3. The semiconductor device according to claim 1, wherein:
The input-side flip-flop group includes first to sixth flip-flops, and the output-side flip-flop group includes seventh to twelfth flip-flops,
an output terminal of the first flip-flop is connected to input terminals of the second and seventh flip-flops,
an output terminal of the second flip-flop is connected to input terminals of the third and eighth flip-flops,
an output terminal of the third flip-flop is connected to input terminals of the fourth and ninth flip-flops,
an output terminal of the fourth flip-flop is connected to input terminals of the fifth and tenth flip-flops,
an output terminal of the fifth flip-flop is connected to input terminals of the sixth and eleventh flip-flops,
an output terminal of the sixth flip-flop is connected to an input terminal of the twelfth flip-flop,
each of the first to the sixth flip-flops receives the first clock signal through a clock input terminal thereof, and each of the seventh to the twelfth flip-flops receives the second clock signal through a clock input terminal thereof,
the first flip-flop receives the serial drive signal through an input terminal thereof,
the seventh flip-flop outputs the high-side U-phase drive signal through an output terminal thereof, the eighth flip-flop outputs the high-side V-phase drive signal through an output terminal thereof, and the ninth flip-flop outputs the high-side W-phase drive signal through an output terminal thereof, and
the tenth flip-flop outputs the low-side U-phase drive signal through an output terminal thereof, the eleventh flip-flop outputs the low-side V-phase drive signal through an output terminal thereof, and the twelfth flip-flop outputs the low-side W-phase drive signal through an output terminal thereof.

* * * * *